United States Patent
Arvin et al.

(10) Patent No.: US 8,299,611 B2
(45) Date of Patent: Oct. 30, 2012

(54) BALL-LIMITING-METALLURGY LAYERS IN SOLDER BALL STRUCTURES

(75) Inventors: Charles L. Arvin, Poughkeepsie, NY (US); Timothy Harrison Daubenspeck, Colchester, VT (US); Wolfgang Sauter, Richmond, VT (US); Timothy Dooling Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 234 days.

(21) Appl. No.: 12/547,540

(22) Filed: Aug. 26, 2009

(65) Prior Publication Data

US 2010/0258940 A1    Oct. 14, 2010

Related U.S. Application Data

(60) Provisional application No. 61/167,595, filed on Apr. 8, 2009.

(51) Int. Cl.
*H01L 23/48* (2006.01)

(52) U.S. Cl. ........ 257/738; 257/758; 257/773; 257/774; 257/775; 257/776; 257/779; 257/780; 257/781; 257/784

(58) Field of Classification Search .......... 257/758, 257/738, 773–776, 779–781, 784, E23.01, 257/E23.015, E23.019, E23.02
See application file for complete search history.

(56) References Cited

U.S. PATENT DOCUMENTS

| | | | |
|---|---|---|---|
| 6,293,457 B1 * | 9/2001 | Srivastava et al. | 228/254 |
| 7,033,923 B2 | 4/2006 | Seshan | |
| 7,034,402 B1 | 4/2006 | Seshan | |
| 7,208,402 B2 * | 4/2007 | Bohr et al. | 438/612 |
| 7,485,564 B2 * | 2/2009 | Daubenspeck et al. | 438/613 |
| 7,545,050 B1 * | 6/2009 | Daubenspeck et al. | 257/779 |
| 7,709,876 B2 * | 5/2010 | Ayotte et al. | 257/296 |
| 2006/0076678 A1 * | 4/2006 | Kim et al. | 257/734 |
| 2006/0244139 A1 * | 11/2006 | Daubenspeck et al. | 257/737 |
| 2007/0252274 A1 * | 11/2007 | Daubenspeck et al. | 257/737 |

* cited by examiner

*Primary Examiner* — Marcos D. Pizarro
*Assistant Examiner* — Bilkis Jahan
(74) *Attorney, Agent, or Firm* — Schmeiser, Olsen & Watts; Richard Kotulak

(57) ABSTRACT

A solder ball structure and a method for forming the same. The structure includes (i) a first dielectric layer which includes a top dielectric surface, (ii) an electrically conductive line, (iii) a second dielectric layer, (iv) a ball-limiting-metallurgy (BLM) region, and (v) a solder ball. The BLM region is electrically connected to the electrically conductive line and the solder ball. The BLM region has a characteristic that a length of the longest straight line segment which is parallel to the top dielectric surface of the first dielectric layer and is entirely in the BLM region does not exceed a pre-specified maximum value. The pre-specified maximum value is at most one-half of a maximum horizontal dimension of the BLM region measured in a horizontal direction parallel to the top dielectric surface of the first dielectric layer.

12 Claims, 15 Drawing Sheets

BALL-LIMITING-METALLURGY LAYERS IN SOLDER BALL STRUCTURES

FIELD OF THE INVENTION

The present invention relates generally to solder ball structures and more particularly to ball-limiting-metallurgy layers in solder ball structures.

BACKGROUND OF THE INVENTION

In a conventional solder ball structure, there is usually film stress in the ball-limiting-metallurgy (BLM) layer and underlying layers. Therefore, there is a need for a BLM structure (and a method for forming the same) in which the deformation produced by stress in the BLM layer and the underlying layers is lower than that of the prior art.

SUMMARY OF THE INVENTION

The present invention provides a structure, comprising a first dielectric layer which includes a top dielectric surface; an electrically conductive line on the first dielectric layer; a second dielectric layer on the first dielectric layer and the electrically conductive line; a ball-limiting-metallurgy (BLM) region on the second dielectric layer and the electrically conductive line, wherein the BLM region is electrically connected to the electrically conductive line; and a solder ball on the BLM region, wherein the solder ball is electrically connected to the BLM region, wherein the BLM region has a characteristic that a length of the longest straight line segment which is parallel to the top dielectric surface of the first dielectric layer and is entirely in the BLM region does not exceed a pre-specified maximum value, and wherein the pre-specified maximum value is at most one-half of a maximum horizontal dimension of the BLM region measured in a horizontal direction parallel to the top dielectric surface of the first dielectric layer.

The present invention provides a BLM structure (and a method for forming the same) in which (i) deformation in chip structures due to stress in the BLM layer and the underlying layers is lower than that of the prior art and (ii) electromigration effect is improved over the prior art.

BRIEF DESCRIPTION OF THE DRAWINGS

FIG. 1B' shows a top-down view of the structure of FIG. 1B, in accordance with embodiments of the present invention.

FIG. 1D' shows a top-down view of the structure of FIG. 1D, in accordance with embodiments of the present invention.

FIG. 1K' shows a top-down view of the structure of FIG. 1K, in accordance with embodiments of the present invention.

FIG. 2B' shows a top-down view of the structure of FIG. 2B, in accordance with embodiments of the present invention.

FIG. 2D' shows a top-down view of the structure of FIG. 2D, in accordance with embodiments of the present invention.

FIG. 3A' shows a top-down view of the structure of FIG. 3A, in accordance with embodiments of the present invention.

DETAILED DESCRIPTION OF THE INVENTION

FIGS. 1A-1K' illustrate a fabrication process of a semiconductor structure 100, in accordance with embodiments of the present invention. More specifically, with reference to FIG. 1A, the fabrication process of the semiconductor structure 100 can start with a semiconductor integrated circuit 102 formed on a wafer (not shown for simplicity) and interconnect layers 104 on top of the semiconductor integrated circuit 102. Next, an inter-level dielectric (ILD) layer 110 can be formed on top of the interconnect layers 104. The ILD layer 110 can comprise a dielectric material such as silicon dioxide. The ILD layer 110 can be formed by a conventional method.

Next, in one embodiment, a metal line 114 and a via 112 are formed in the ILD layer 110. The via 112 provides electrical connections from the metal line 114 to devices such as transistors, capacitors, and resistors (not shown) of the semiconductor integrated circuit 102 through the interconnect layers 104. The metal line 114 and the via 112 can comprise an electrically conductive material such as copper. The metal line 114 and the via 112 can be formed by a conventional dual damascene process. The ILD layer 110, the metal line 114, and the via 112 constitute the top interconnect layer 110+114+112 of the integrated circuit 102. It should be noted that, in the following figures, the interconnect layers 104 and the integrated circuit 102 are not shown for simplicity.

Figure 1A:
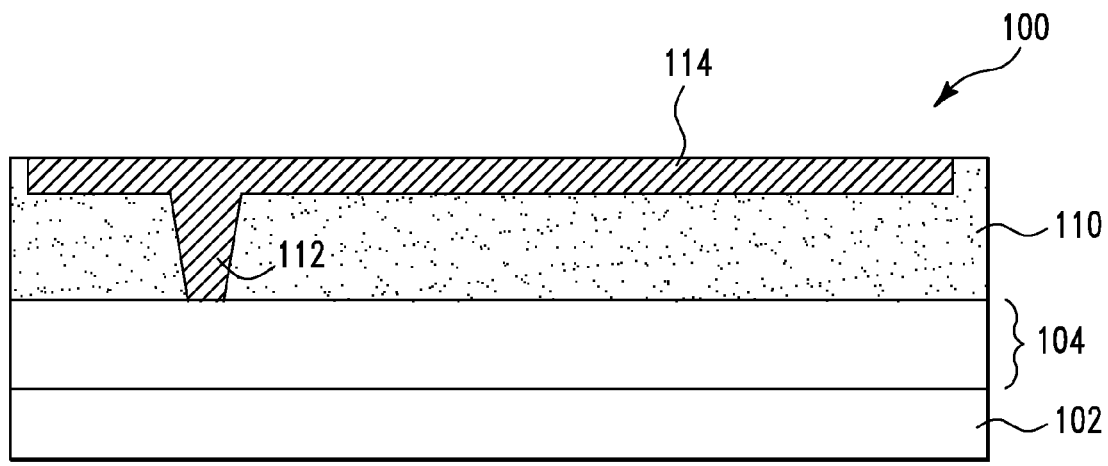
FIG. 1A shows a cross-section view of a semiconductor structure for illustrating a fabrication process, in accordance with embodiments of the present invention.
Figure 1B:
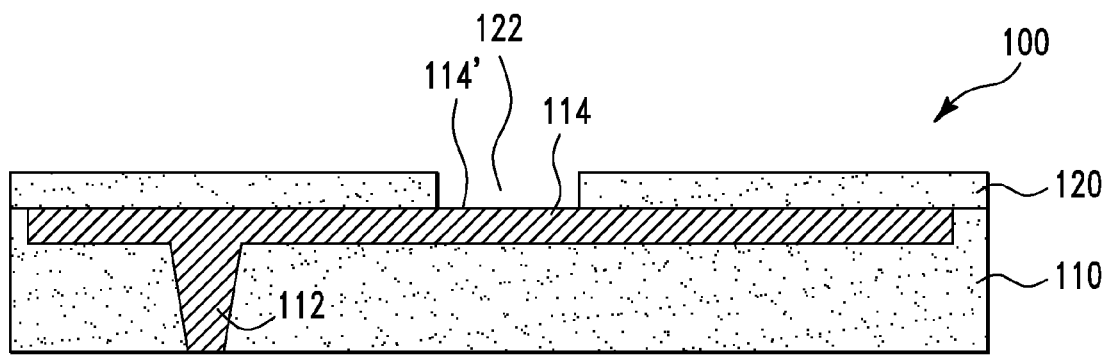
FIG. 1B shows a cross-section view of a semiconductor structure resulting from forming a dielectric layer having an opening on the structure of FIG. 1A, in accordance with embodiments of the present invention.
Figure 1B:
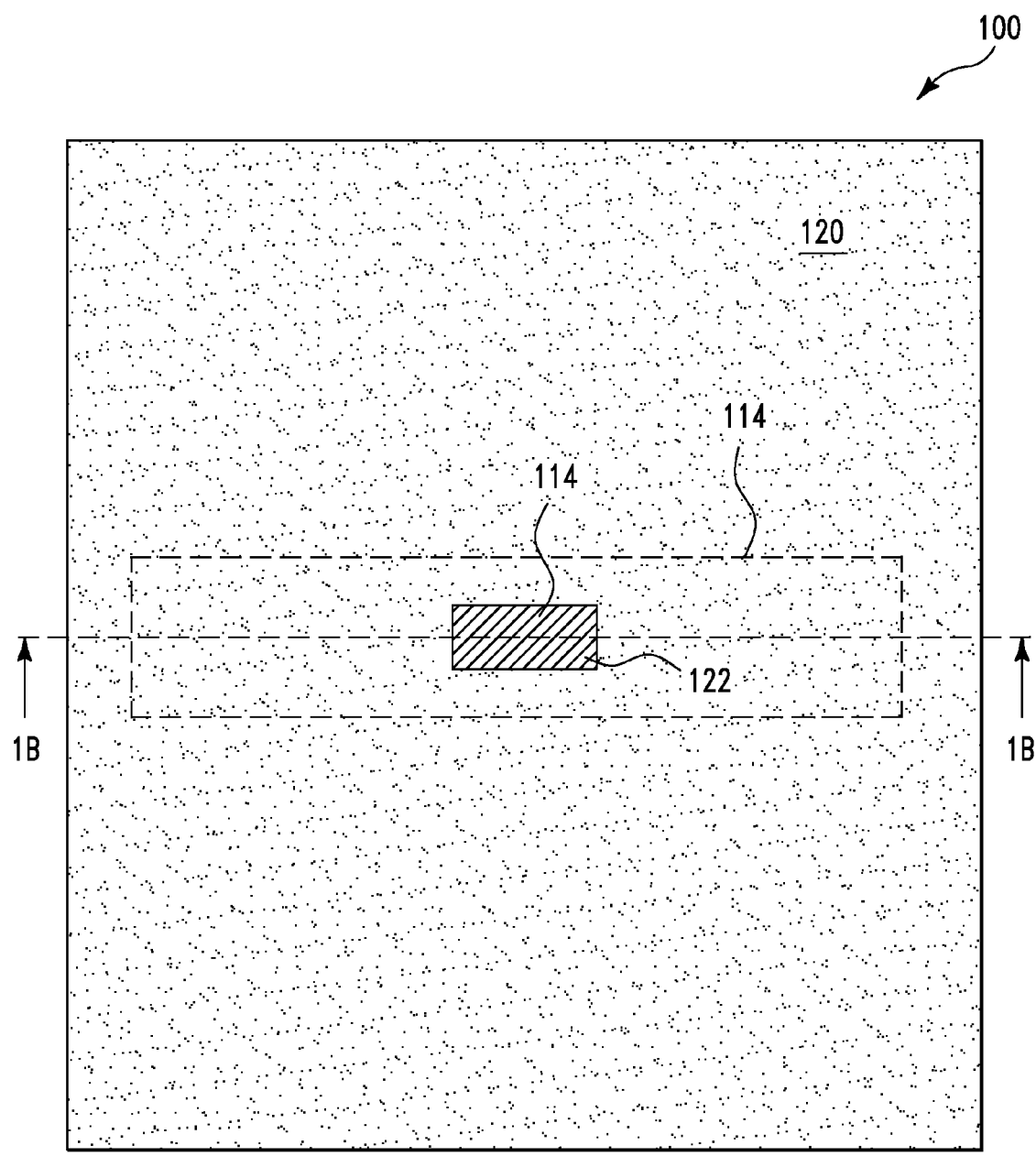

Next, with reference to FIG. 1B, in one embodiment, a dielectric layer 120 is formed on top of the interconnect layer 110+114+112. The dielectric layer 120 can comprise silicon dioxide and/or or silicon nitride. The dielectric layer 120 can be formed by CVD (Chemical Vapor Deposition) of silicon dioxide on top of the interconnect layer 110+114+112.

Next, in one embodiment, an opening 122 is formed in the dielectric layer 120 such that the top surface 114' of the metal line 114 is exposed to the surrounding ambient through the opening 122. FIG. 1B' shows a top-down view of the structure 100 of FIG. 1B, in accordance with embodiments of the present invention. With reference to FIGS. 1B and 1B', it should be noted that FIG. 1B shows a cross-section view of the structure 100 of FIG. 1B' along a line 1B-1B of FIG. 1B'.

Figure 1C:
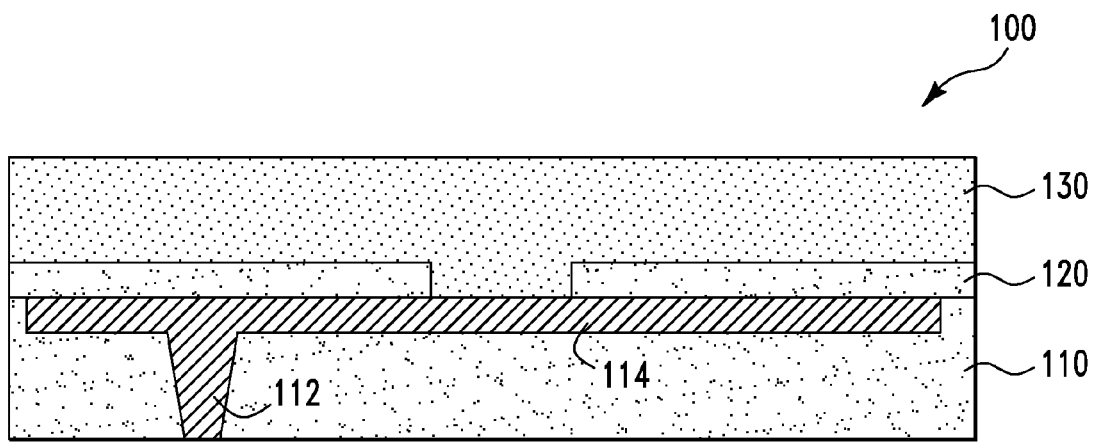
FIG. 1C shows a cross-section view of a semiconductor structure resulting from forming a passivation layer on the structure of FIG. 1B, in accordance with embodiments of the present invention.

Next, with reference to FIG. 1C, in one embodiment, a passivation layer 130 is formed on top of the structure 100 of FIG. 1B resulting in the structure 100 of FIG. 1C. The passivation layer 130 can comprise polyimide. If polyimide is used, the passivation layer 130 can be formed by a conventional spin-on process.

Figure 1D:
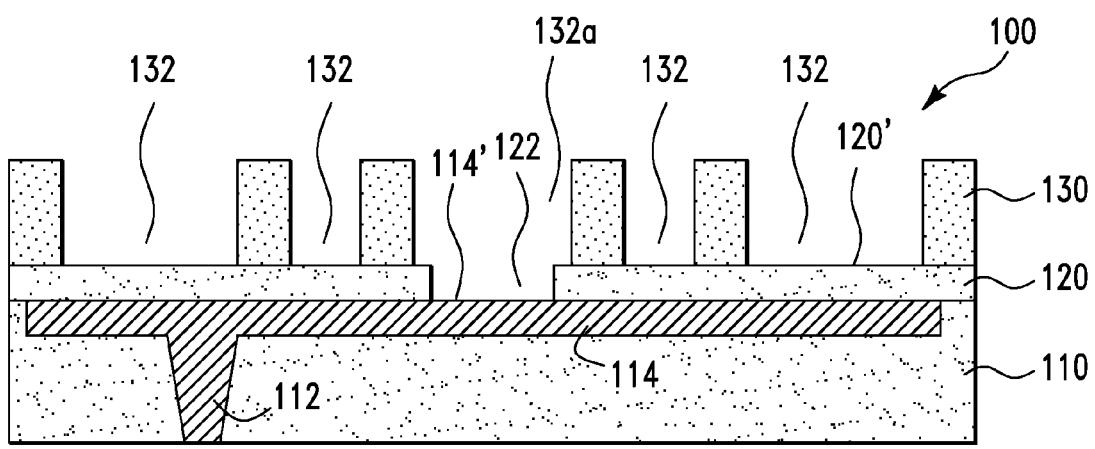
FIG. 1D shows a cross-section view of a semiconductor structure resulting from patterning the passivation layer of the structure of FIG. 1C, in accordance with embodiments of the present invention.
Figure 1D:
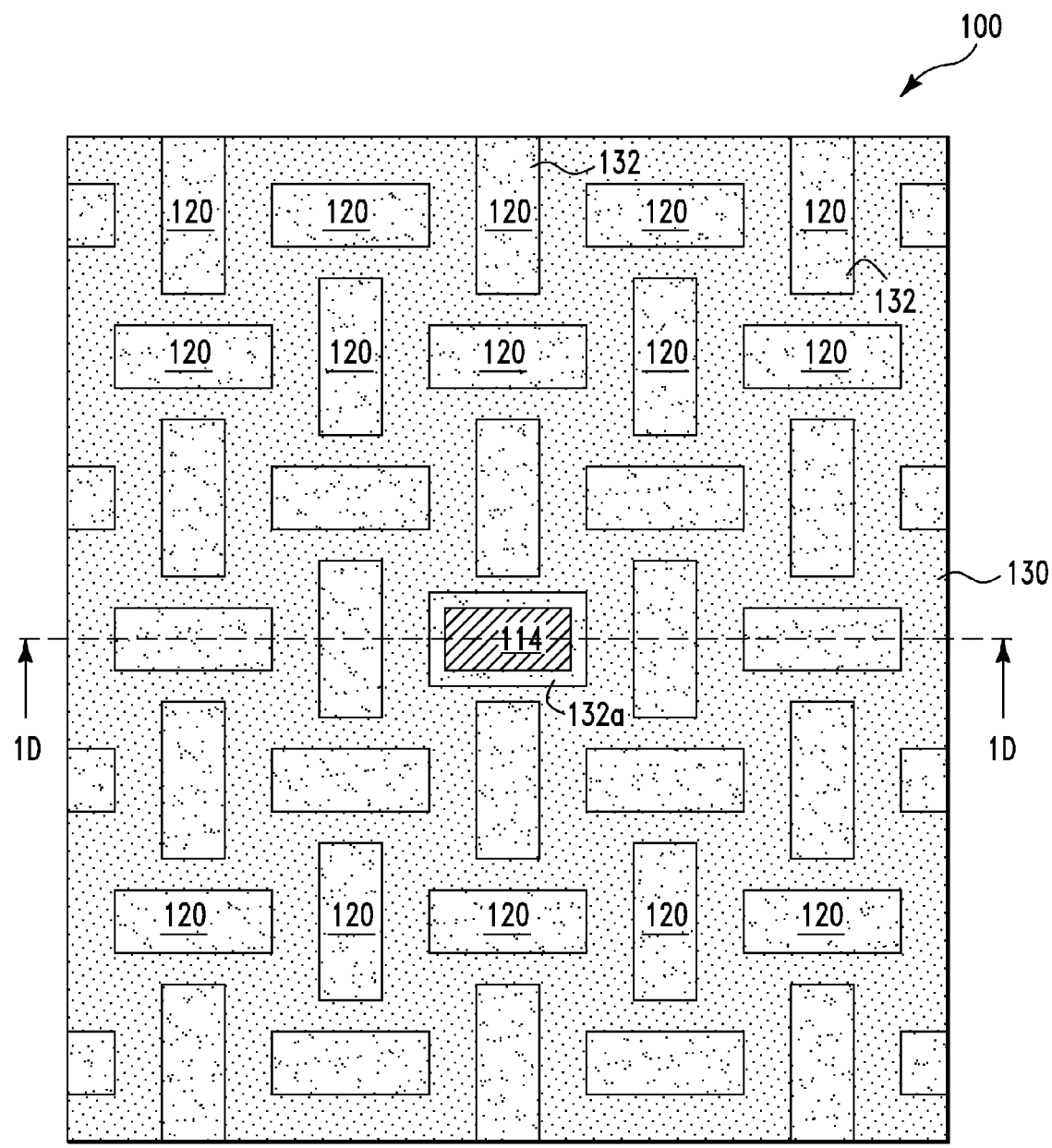

Next, in one embodiment, the polyimide layer 130 is patterned resulting in the structure 100 of FIG. 1D. More details on this patterning of the polyimide layer 130 are discussed below with reference to FIGS. 1D and 1D'. FIG. 1D' shows a top-down view of the structure 100 of FIG. 1D, in accordance with embodiments of the present invention. With reference to FIGS. 1D and 1D', it should be noted that FIG. 1D shows a cross-section view of the structure 100 of FIG. 1D' along a line 1D-1D of FIG. 1D'.

In one embodiment, with reference to FIGS. 1D and 1D', more specifically, the polyimide layer 130 is patterned resulting in polyimide openings 132 and 132a such that the top surface 114' of the metal line 114 is exposed to the surrounding ambient through the polyimide opening 132a and the opening 122, as shown in FIG. 1D. In addition, in one embodiment, the polyimide layer 130 is patterned such that a ball-limiting-metallurgy (BLM) region 140 (FIG. 1E) which is subsequently formed will have the characteristic that the length of the longest straight line segment which is parallel to the top surface 110' of the dielectric layer 110 and is entirely in the BLM region 140 does not exceed a pre-specified maximum value. In other words, the distance that an imaginary point could continuously travel on any straight line parallel to the top surface 110' of the dielectric layer 110 and inside the BLM region 140 does not exceed the pre-specified maximum value.

Figure 1E:
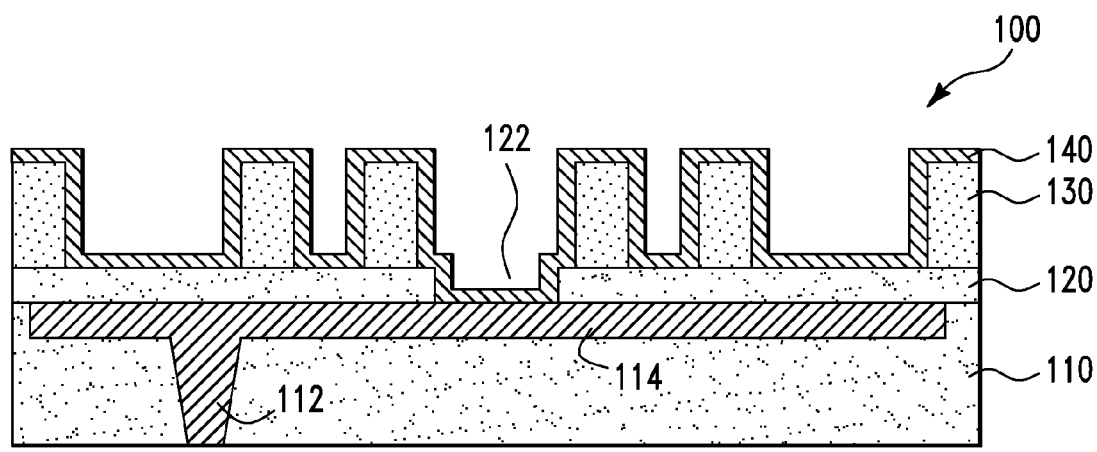
FIG. 1E shows a cross-section view of a semiconductor structure resulting from forming a ball-limiting-metallurgy (BLM) layer on the structure of FIG. 1D, in accordance with embodiments of the present invention.

Next, with reference to FIG. 1E, a ball-limiting-metallurgy (BLM) layer 140 is formed on top of the structure 100 of FIG. 1D. The BLM layer 140 can comprise three layers: a titanium-tungsten (TiW) alloy layer (not shown), a copper layer (not shown) on top of the TiW alloy layer, and a nickel layer (not shown) on top of the copper layer. The BLM layer 140 can be formed by a combination of conventional PVD (Physical Vapor Deposition) and plating processes.

Figure 1F:
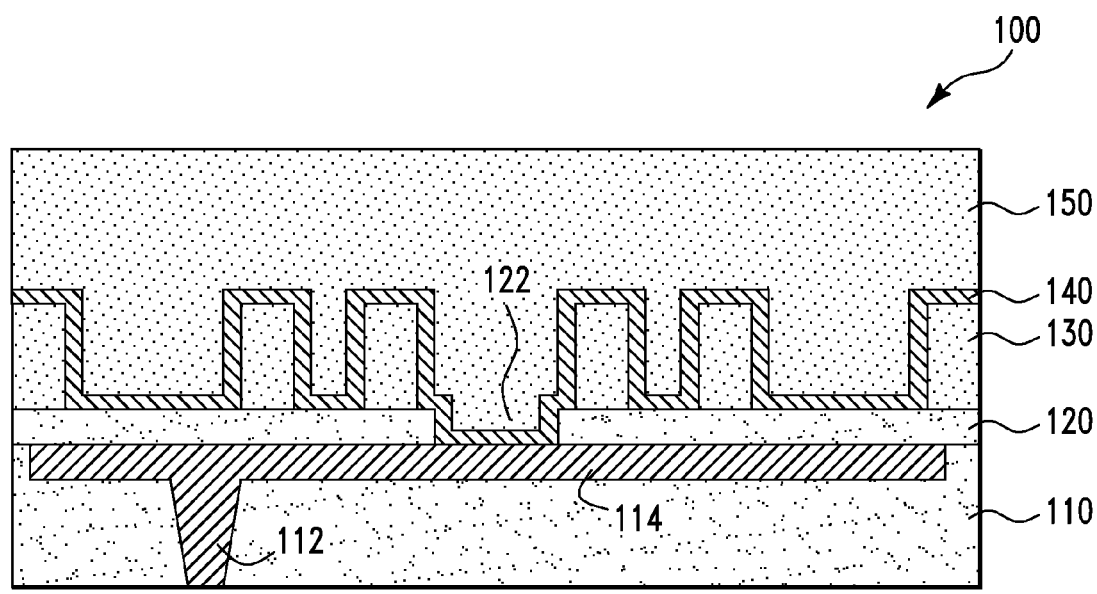
FIG. 1F shows a cross-section view of a semiconductor structure resulting from forming a photoresist layer on the BLM layer of the structure of FIG. 1E, in accordance with embodiments of the present invention.
Figure 1G:
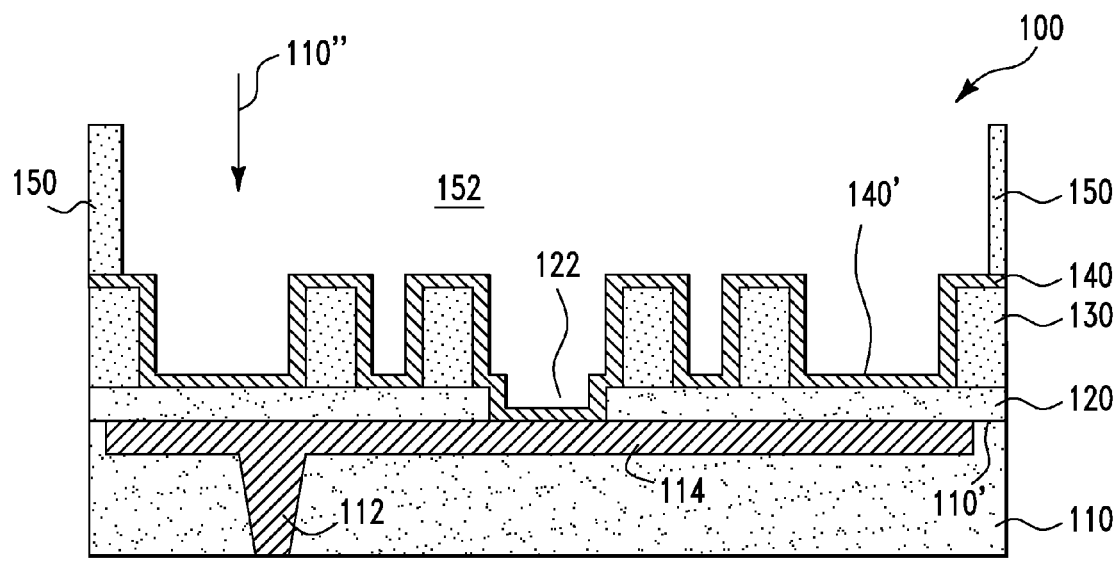
FIG. 1G shows a cross-section view of a semiconductor structure resulting from forming a hole in the photoresist layer of the structure of FIG. 1F, in accordance with embodiments of the present invention.

Next, with reference to FIG. 1F, in one embodiment, a photoresist layer 150 is formed on top of the BLM layer 140. The photoresist layer 150 can be formed by a conventional spin-on process.

Next, in one embodiment, the photoresist layer 150 is patterned resulting in a hole 152 in the photoresist layer 150 (FIG. 1G) such that (i) the top surface 140' of the BLM layer 140 is exposed to the surrounding ambient and (ii) the opening 122 entirely overlaps the hole 152 in a direction defined by an arrow 110" (hereafter can be referred to as the direction 110"). The direction 110" is perpendicular to the top surface 110' of the ILD layer 110 and points from the dielectric layer 120 to the ILD layer 110. It is said that a first region entirely overlaps a second region in a reference direction if, for any point of the first region, a straight line going through that point and being parallel to the reference direction would intersect the second region. In one embodiment, the photoresist layer 150 is patterned by a conventional lithographic process.

Figure 1H:
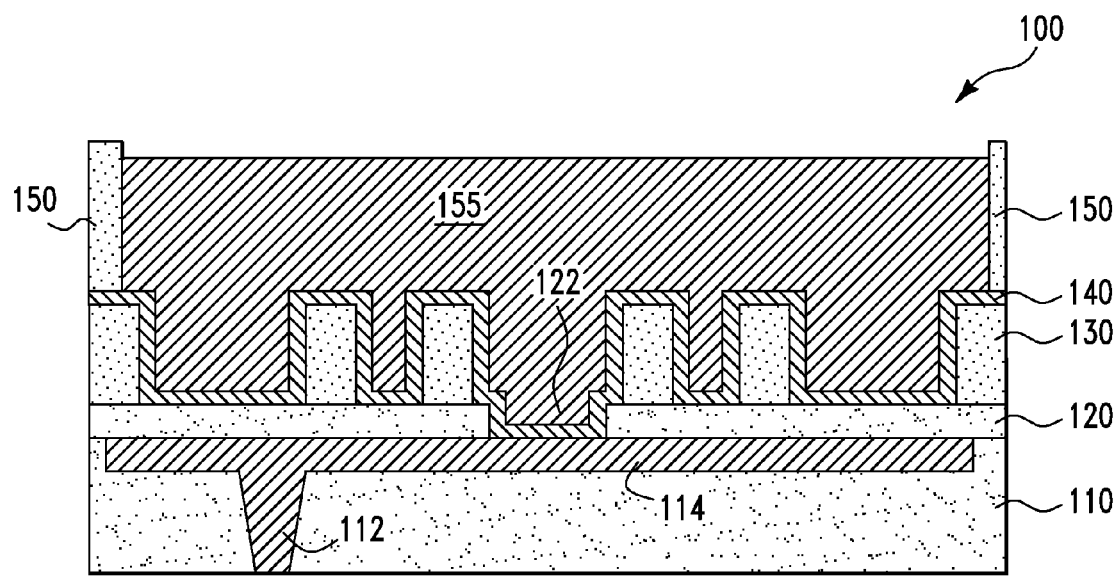
FIG. 1H shows a cross-section view of a semiconductor structure resulting from forming an electrically conductive region in the hole of the structure of FIG. 1G, in accordance with embodiments of the present invention.

Next, with reference to FIG. 1H, in one embodiment, the hole 152 is filled with an electrically conductive material resulting in an electrically conductive region 155. The electrically conductive material used to fill the hole 152 can comprise a mixture of tin and lead or a lead-free mixture of different metals. The hole 152 can be filled with the electrically conductive material by electroplating.

Figure 1I:
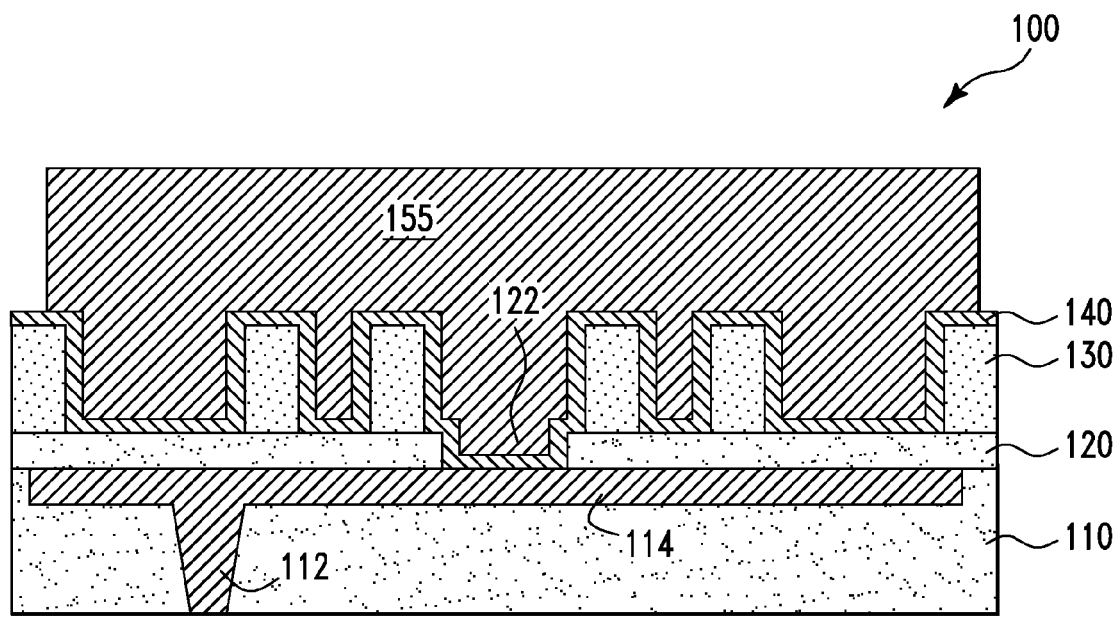
FIG. 1I shows a cross-section view of a semiconductor structure resulting from removing the photoresist layer of the structure of FIG. 1H, in accordance with embodiments of the present invention.

Next, in one embodiment, the photoresist layer 150 is removed resulting in the structure 100 of FIG. 1I. The photoresist layer 150 can be removed by a wet etching process.

Figure 1J:
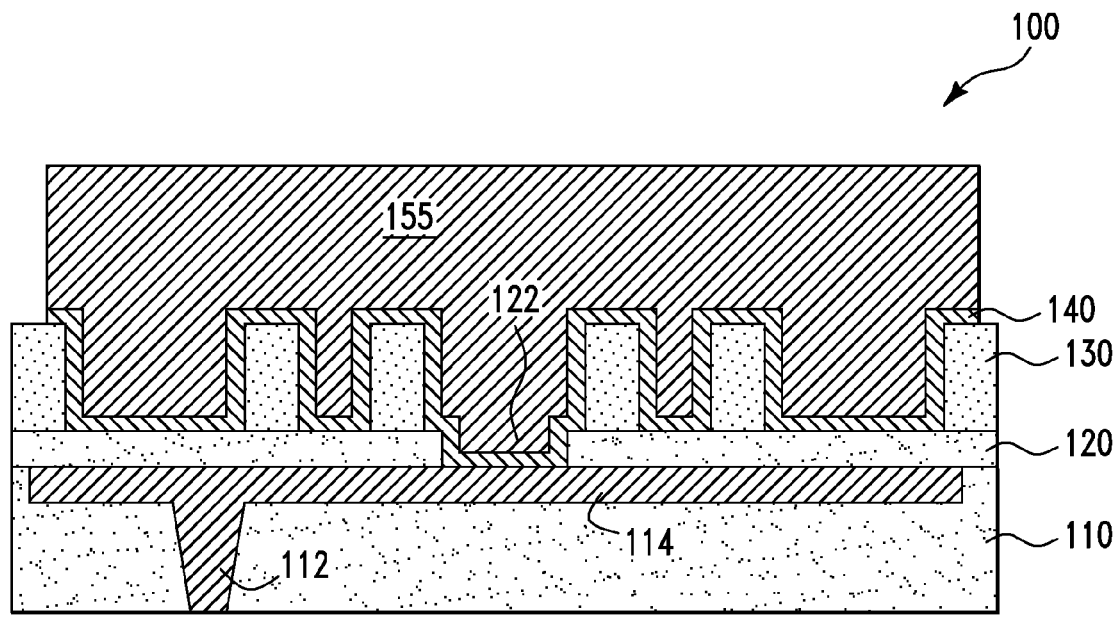
FIG. 1J shows a cross-section view of a semiconductor structure resulting from patterning the BLM layer of the structure of FIG. 1I resulting in a BLM region, in accordance with embodiments of the present invention.

Next, with reference to FIG. 1I, in one embodiment, the BLM layer 140 is patterned resulting in the BLM region 140 of FIG. 1J. The BLM layer 140 can be patterned by a $H_2O_2$-based wet etch or dry etch process followed by electroetching using the electrically conductive region 155 as a blocking mask.

Figure 1K:
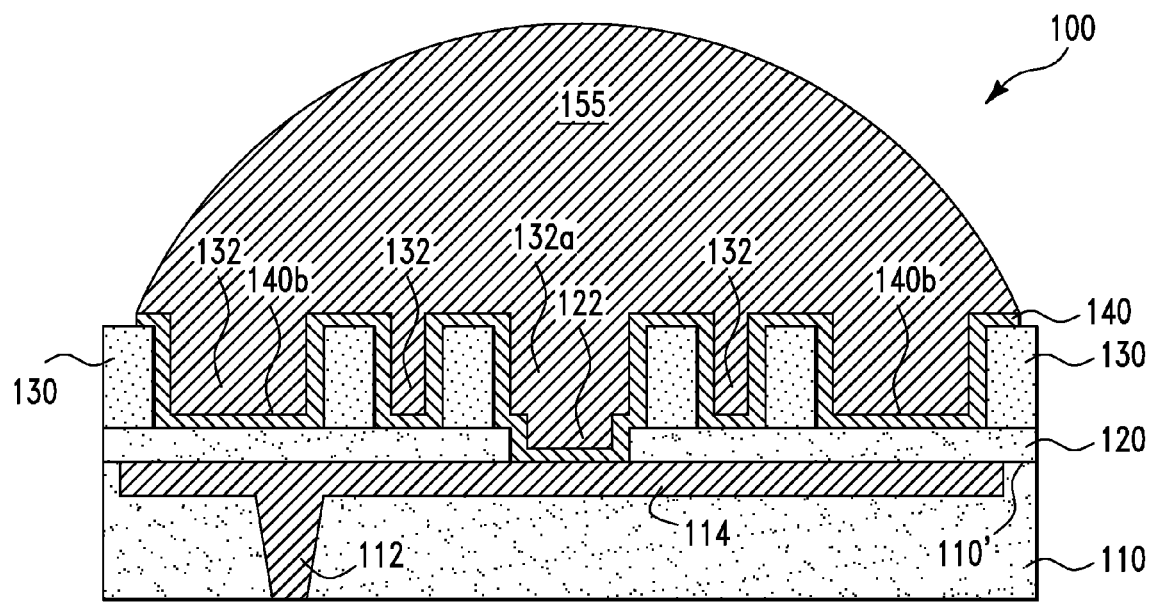
FIG. 1K shows a cross-section view of a semiconductor structure resulting from forming a solder ball on the BLM region of the structure of FIG. 1J, in accordance with embodiments of the present invention.
Figure 1K:
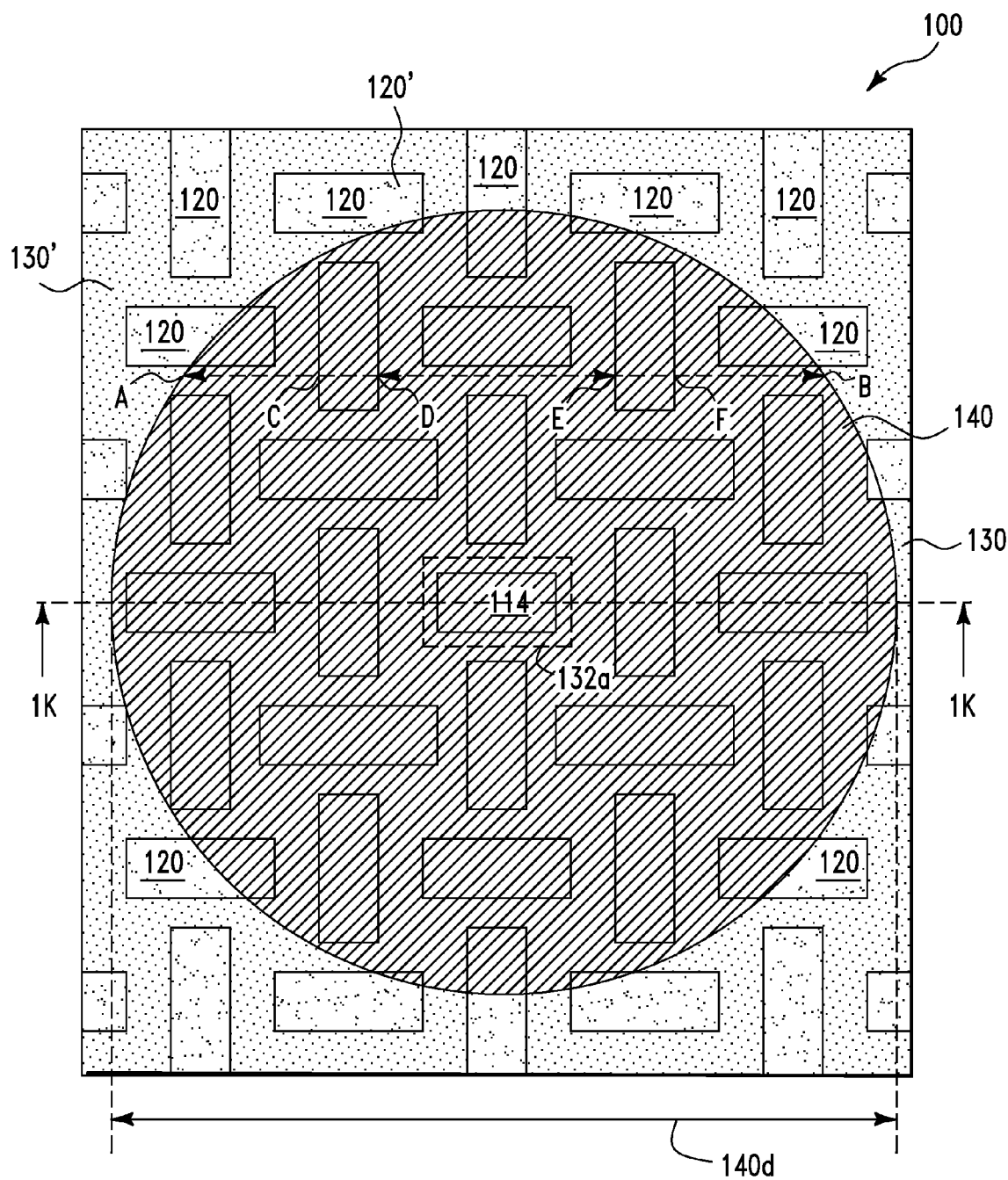

Next, with reference to FIG. 1K, the electrically conductive region 155 is heated and reshaped by a reflow process resulting in the solder ball 155 on the BLM region 140, as shown in FIG. 1K. FIG. 1K' shows a top-down view of the structure 100 of FIG. 1K, in accordance with embodiments of the present invention. With reference to FIGS. 1K and 1K', it should be noted that FIG. 1K shows a cross-section view of the structure 100 of FIG. 1K' along a line 1K-1K of FIG. 1K'. It should be noted that the distance that an imaginary point could continuously travel on a straight line parallel to the top surface 110' of the dielectric layer 110 and inside the BLM region 140 does not exceed a pre-specified maximum value as stated above with reference to FIG. 1K'. In one embodiment, the structure 100 of FIG. 1K has other solder balls (not shown) similar to the solder ball 155, but not shown for simplicity. It should be noted that during the reflow process, the metals of the BLM region 140 of FIG. 1J inter-react with the metals of the metal line 114 and the solder ball 155 resulting in the reacted BLM region 140 of FIG. 1K.

Next, in one embodiment, the structure 100 of FIG. 1K (which includes the integrated circuit 102 of FIG. 1A) is cut out from the wafer (not shown). This process is usually called chip dicing. After the chip dicing is performed, the solder ball 155 and other similar solder balls of the integrated circuit 102 (FIG. 1A) are attached one-to-one to substrate pads (not shown) of a substrate (not shown) at a high temperature resulting in a chip module and then the chip module is cooled down. It should be noted that the chip and the substrate usually have different thermal expansion coefficients. This difference of the thermal expansion coefficients causes stress in the BLM region 140 itself and in the layers beneath the BLM region 140. This stress needs to be minimized.

With reference to FIGS. 1K and 1K', the inventors of the present invention have found that, the greater the distance that an imaginary point could continuously travel on a straight line parallel to the top surface 110' of the dielectric layer 110 and inside the BLM region 140 is, the higher is the deformation in the chip below the BLM region 140 due to the stress in the BLM region 140 itself. If earlier the polyimide layer 130 were patterned only to expose the top surface 114' of the metal line 114 to the surrounding ambient (i.e., only the polyimide opening 132a but not the other polyimide openings 132 is created in FIG. 1D), then the imaginary point could continuously travel on a straight line AB (from point A to point B) parallel to the top surface 110' of the dielectric layer 110 and inside the BLM region 140 (FIGS. 1K and 1K'). With the patterning of the polyimide layer 130 as shown in FIGS. 1K and 1K', an imaginary point continuously traveling from point A toward point B on a straight line parallel to the top surface 110' of the dielectric layer 110 and inside the BLM region 140 will stop at point C. This is because if that imaginary point continues on that straight line toward point B, it will exit the BLM region 140 and enter the solder ball 155. If an imaginary point is to continuously travel on a straight line going through point A and point B parallel to the top surface 110' of the dielectric layer 110 and inside the BLM region 140, then it could only continuously travel on three line segments AC, DE, or FB. The length of the line segment AB is greater than the length of any one of the line segments AC, DE, and FB. As a result, the deformation in the layers beneath the BLM region 140 is lower than in the case where the polyimide layer 130 is patterned only to expose the top surface 114' of the metal line 114 to the surrounding ambient.

In one embodiment, the distance that an imaginary point could continuously travel on a straight line parallel to the top surface 110' of the dielectric layer 110 and inside the BLM region 140 (FIGS. 1K and 1K') does not exceed a pre-specified maximum value. In one embodiment, the pre-specified maximum value does not exceed a half of the diameter 140d of the BLM region 140. Alternatively, if the BLM region 140 does not have a circle shape, the pre-specified maximum value does not exceed one half of the maximum horizontal dimension of the BLM region 140. In an alternative embodiment, the pre-specified maximum value does not exceed one-fourth of the maximum horizontal dimension of the BLM region 140.

In one embodiment, the pre-specified maximum value can be determined as follows. Firstly, the diameter 140d of the BLM region 140 (FIG. 1K') is determined (e.g., 100 µm). As a result, the pre-specified maximum value can be determined to be one half of the diameter 140d (e.g., 50 µm). Then, the pattern which is to be transferred to the polyimide layer 130 of FIG. 1C is designed. This pattern must ensure that the subsequently formed BLM region 140 (FIG. 1K) has the characteristic that the distance that an imaginary point could continuously travel on a straight line parallel to the top surface 110' of the dielectric layer 110 and inside the BLM region 140 does not exceed the pre-specified maximum value determined earlier (i.e., 50 µm). After the pattern is designed, the pattern is transferred to the polyimide layer 130 of FIG. 1C resulting in the polyimide openings 132 and 132a as shown in FIG. 1D. After that, other steps are performed on the structure 100 of FIG. 1D resulting in the structure 100 of FIG. 1K as described above.

With reference to FIG. 1K, the BLM region 140 has the characteristic that if water is poured on top of the BLM region 140 (assuming the solder ball 155 is not present), then there will be at least two bodies of water which remain in the openings 132 and 132a and each of which is not in direct physical contact with any other body of water.

FIGS. 2A-2D' illustrate a fabrication process of a semiconductor structure 200, in accordance with embodiments of the present invention. More specifically, with reference to FIG. 2A, the fabrication process can start with the semiconductor structure 200 of FIG. 2A. The structure 200 is similar to the structure 100 of FIG. 1C. The formation of the structure 200 is similar to the formation of the structure 100 of FIG. 1C.

Figure 2A:
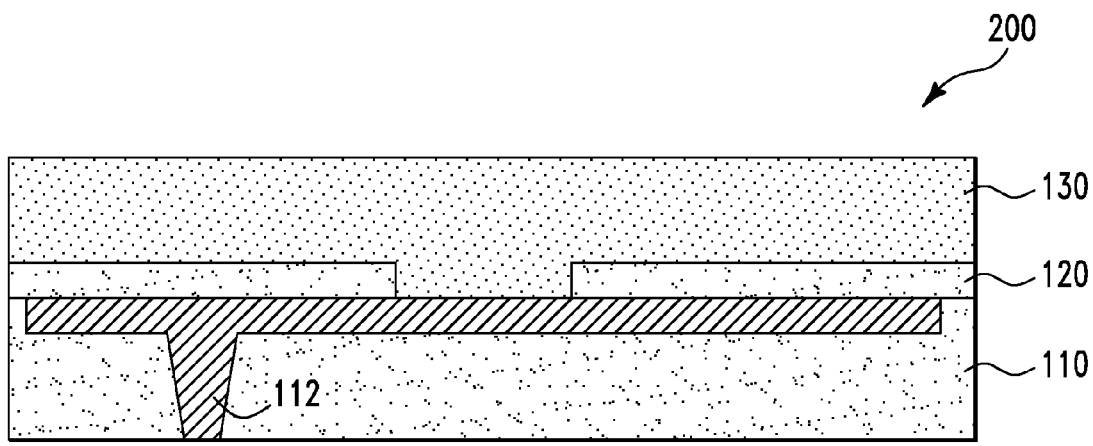
FIG. 2A shows a cross-section view of another semiconductor structure for illustrating a fabrication process, in accordance with embodiments of the present invention.
Figure 2B:
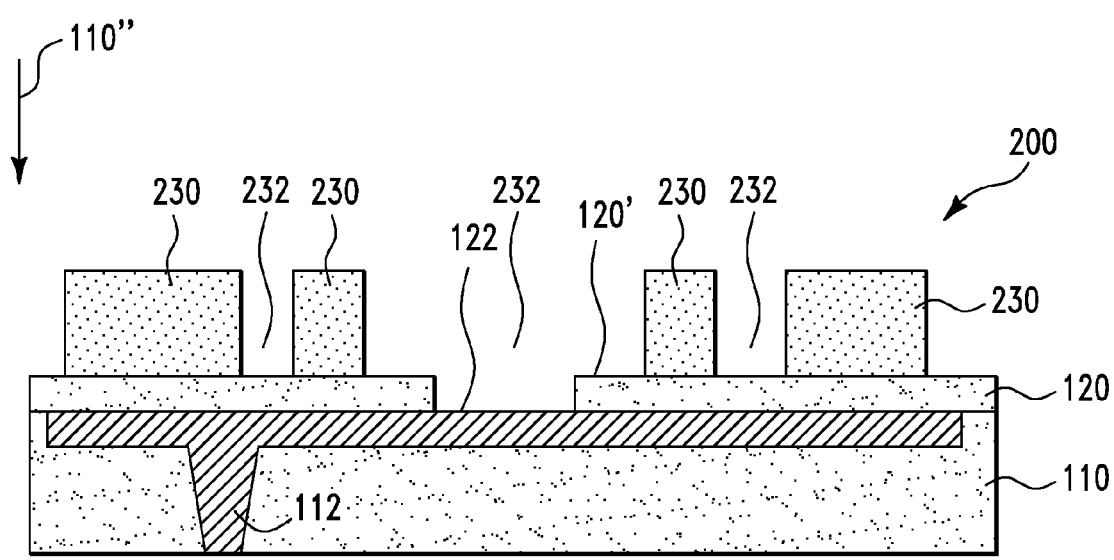
FIG. 2B shows a cross-section view of a semiconductor structure resulting from patterning the passivation layer of the structure of FIG. 2A, in accordance with embodiments of the present invention.
Figure 2B:
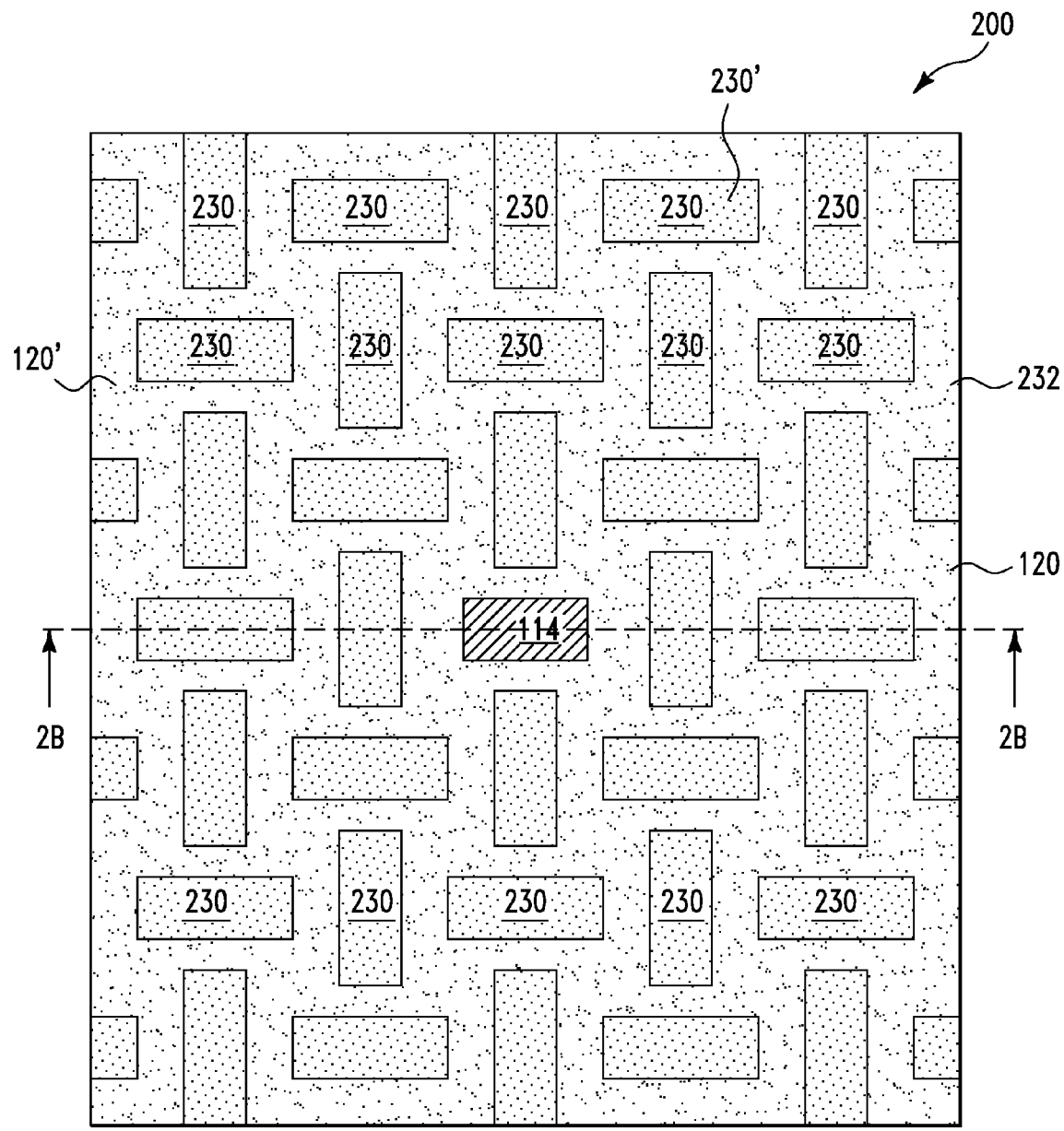

Next, in one embodiment, the polyimide layer 130 is patterned resulting in the structure 200 of FIG. 2B. More details on this patterning of the polyimide layer 130 are discussed below with reference to FIGS. 2B and 2B'. FIG. 2B' shows a top-down view of the structure 200 of FIG. 2B, in accordance with embodiments of the present invention. With reference to FIGS. 2B and 2B', it should be noted that FIG. 2B shows a cross-section view of the structure 200 of FIG. 2B' along a line 2B-2B of FIG. 2B'.

In one embodiment, with reference to FIG. 2B, more specifically, the polyimide layer 130 is patterned resulting in trenches 232 such that the top surface 114' of the metal line 114 is exposed to the surrounding ambient through the trenches 232, as shown in FIG. 2B. In addition, the polyimide layer 130 is patterned such that a ball-limiting-metallurgy (BLM) region 240 (FIG. 2D) which is subsequently formed will have the characteristic that the distance that an imaginary point could continuously travel on a straight line parallel to the top surface 110' of the dielectric layer 110 and inside the BLM region 240 does not exceed a pre-specified maximum value. In one embodiment, the trenches 232 are connected together (i.e., the trenches 232 are not physically isolated from one another). After the patterning of the polyimide layer 130 is performed, the remaining portions of the polyimide layer 130 are referred to as polyimide regions 230. The polyimide layer 130 can be patterned by a conventional lithographic process.

Figure 2C:
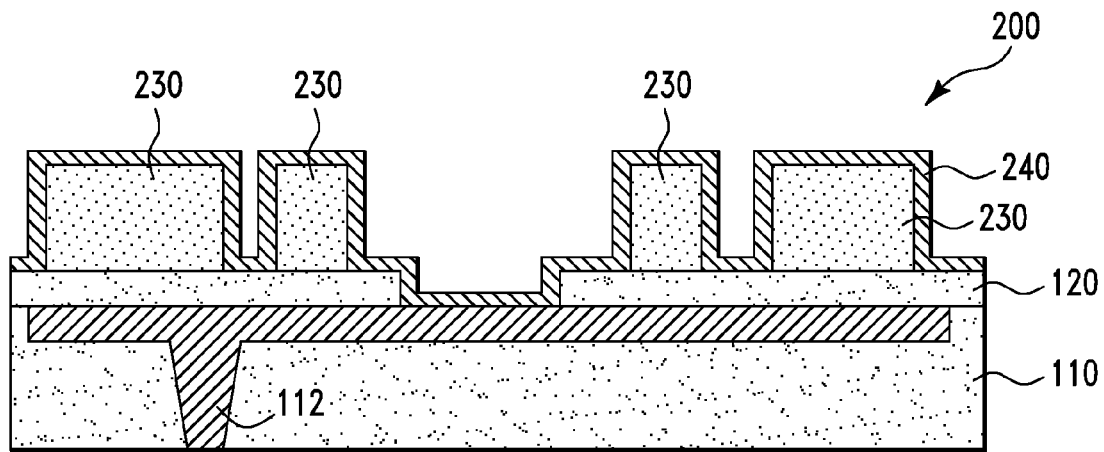
FIG. 2C shows a cross-section view of a semiconductor structure resulting from forming a BLM layer on the structure of FIG. 2B, in accordance with embodiments of the present invention.

Next, with reference to FIG. 2C, in one embodiment, a ball-limiting-metallurgy (BLM) layer 240 is formed on top of the structure 200 of FIG. 2C. The BLM layer 240 can comprise three layers: a titanium-tungsten (TiW) alloy layer (not shown), a copper layer (not shown) on top of the TiW alloy layer, and a nickel layer (not shown) on top of the copper layer. The BLM layer 240 can be formed by a combination of conventional plating and PVD processes.

Figure 2D:
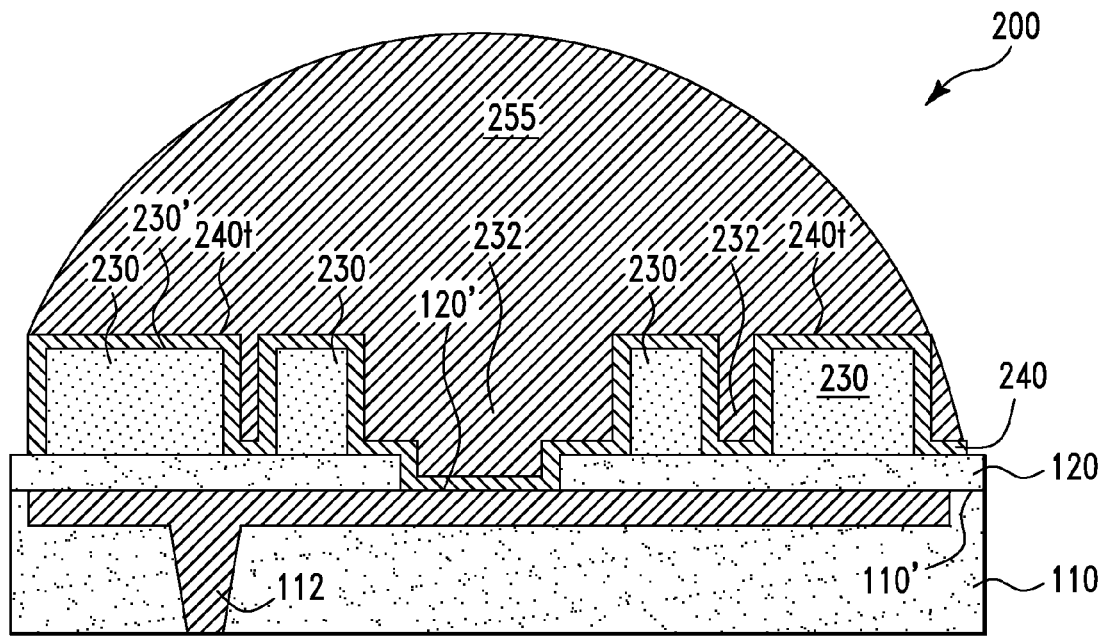
FIG. 2D shows a cross-section view of a semiconductor structure resulting from forming a solder ball on the structure of FIG. 2C, in accordance with embodiments of the present invention.
Figure 2D:
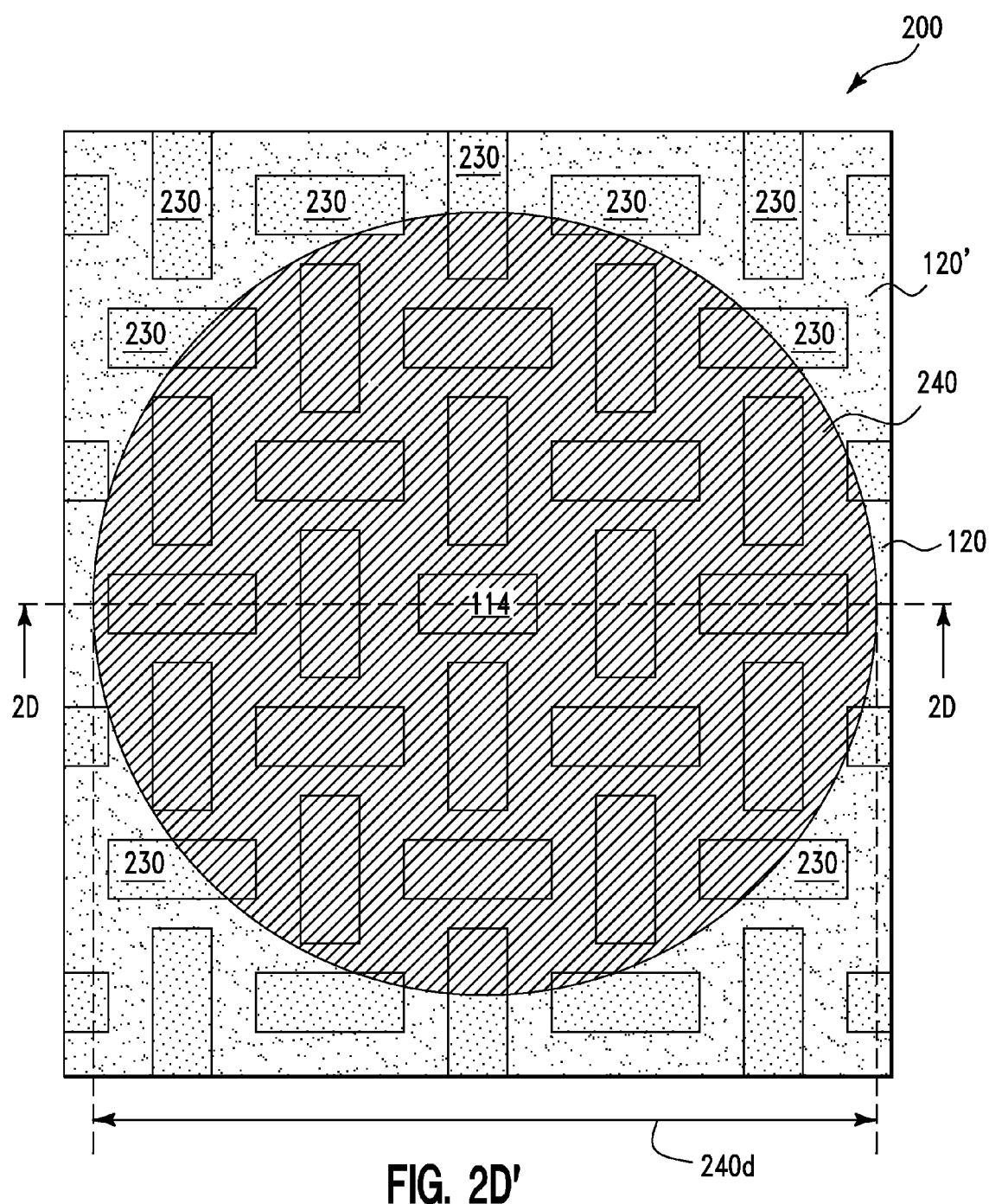

Next, with reference to FIG. 2D, the BLM region 240 and a solder ball 255 are formed. The solder ball 255 can comprise a mixture of tin and lead or a lead-free mixture of different metals. The BLM region 240 and the solder ball 255 can be formed in a manner similar to the manner in which the BLM layer 140 and the solder ball 150 of FIG. 1K are formed. In one embodiment, the structure 200 of FIG. 2B has other solder balls (not shown) similar to the solder ball 255, but not shown for simplicity.

Next, in one embodiment, a chip dicing process is performed, then the solder ball 255 and other similar solder balls of the integrated circuit 102 (FIG. 1A) are attached one-to-one to substrate pads (not shown) of a substrate (not shown) at a high temperature resulting in a chip module, and then the chip module is cooled down.

With the formation of the polyimide regions 230 as shown in FIG. 2B, the deformation (due to the stress in the BLM region 140) in the layers beneath the BLM region 140 is lower than the stress in the case where the polyimide layer 130 is patterned only to expose the top surface 114' of the metal line 114 to the surrounding ambient.

In one embodiment, the distance that an imaginary point could continuously travel on a straight line parallel to the top surface 110' of the dielectric layer 110 and inside the BLM region 240 (FIGS. 2D and 2D') does not exceed a pre-specified maximum value. In one embodiment, the pre-specified maximum value does not exceed a half of the diameter 240*d* of the BLM region 240. Alternatively, the pre-specified maximum value does not exceed one-fourth of the diameter 240*d* of the BLM region 240.

With reference to FIG. 2D, the BLM region 240 comprises top BLM surfaces 240*t*. It should be noted that the BLM region 240 of FIG. 2D has the characteristic that there exists at least two different points on the top BLM surfaces such that there does not exist a line (whether straight or not) that connects these two points and the entire line is on the bottom BLM surfaces.

With reference to FIG. 2D, the BLM region 240 has the characteristic that if the BLM region 240 is flipped upside-down and subsequently water is poured on top of the BLM region 240 (assuming the dielectric layers 110 and 120 and the polyimide layer 230 are not present), then there will be at least two bodies of water which remain on top of the BLM region 240 and each of which is not in direct physical contact with any other body of water.

Figure 3A:
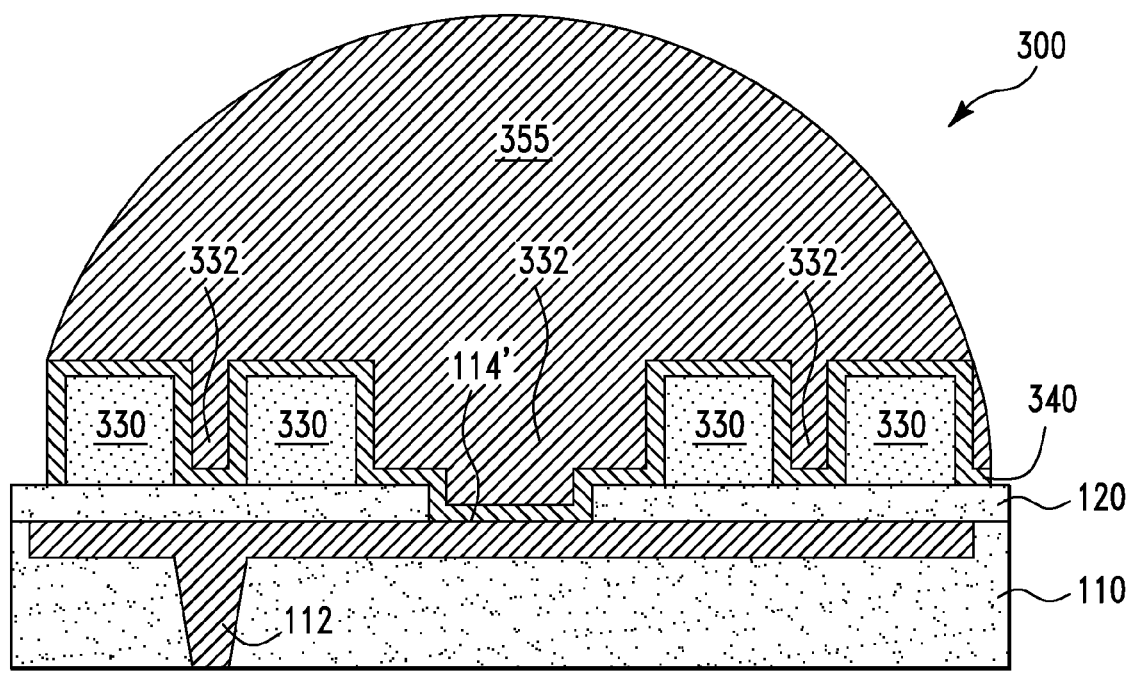
FIG. 3A shows a cross-section view of an alternative semiconductor structure, in accordance with embodiments of the present invention.
Figure 3A:
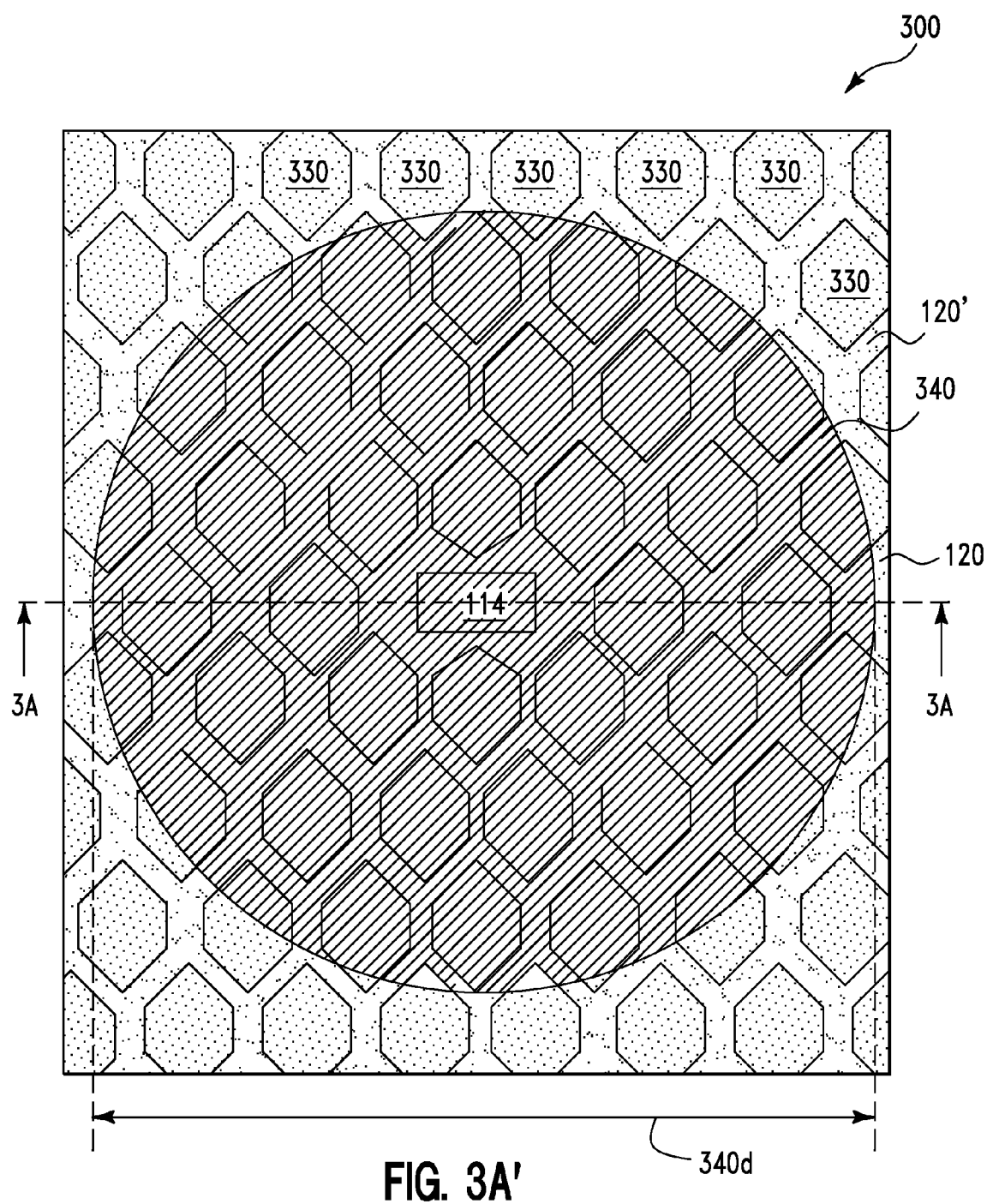

FIGS. 3A-3A' illustrate a semiconductor structure 300, in accordance with embodiments of the present invention. More specifically, with reference to FIG. 3A, the structure 300 is similar to the structure 200 of FIG. 2D except that the polyimide regions 330 of FIG. 3A have the hexagon shape (instead of the rectangular shape of the polyimide region 230 of FIG. 2D'). It should be noted that FIG. 3A shows a cross-section view of the structure 300 of FIG. 3A' along a line 3A-3A of FIG. 3A'. Similar to the structure 200 of FIG. 2D, the stress in the BLM region 340 and in the layers beneath the BLM region 340 is lower than the stress in the case where the polyimide layer 330 is patterned only to expose the top surface 114' of the metal line 114 to the surrounding ambient.

With reference to FIG. 1D, in one embodiment, the sidewalls of the polyimide openings 132 and 132*a* in the polyimide layer 130 can be tapered. The advantage to this is that for a subsequent PVD deposition, the amount of metal deposited on the sidewalls will depend directly on the angle of the taper. For thinner layers of deposited metal, the metallurgical reaction that occurs during subsequent reflow of the solder ball 155 (FIGS. 1J-1K) will be driven to greater completion, such that the sidewalls will then have a significantly greater resistivity than the BLM region 140 (FIG. 1K) at the bottom and top of the polyimide shapes. The resistivity of the intermetallics is greater than that of the pure metals so that the sidewall resistance can be tailored to keep most of the current at the floor of the BLM region 140 for the case where the polyimide shapes 130 are pillars. This promotes better current redistribution over the surface of the BLM region 140 (FIG. 1K), which reduces the localized current density and thus provides improved electromigration lifetime.

It should be noted that the thickness of the reacted BLM region 140 after reflowing (FIG. 1K) is greater than the thickness of the deposited BLM region 140 before reflowing (FIG. 1J). In one embodiment, with reference to FIG. 1K, the height of the polyimide pillars (i.e., the thickness of the polyimide layer 130) is greater than the thickness of the reacted BLM region 140.

In one embodiment, with reference to FIG. 1E, in order to ensure that the Cu layer (not shown) of the BLM layer 140 is not later consumed during the metallurgical reactions of the reflow process, an additional protective film (not shown), such as TaN or Ta, or multiple protective films (not shown) such as Ta/TaN or TaN/Ta, can be deposited over the Cu layer before the deposition of the nickel layer (not shown) as described above. Alternatively, the Ni layer of the BLM layer 140 (FIG. 1E) can be sufficiently thick to protect the Cu layer of BLM layer 140 from being later consumed during the metallurgical reactions of the reflow process.

In the embodiments described above, with reference to FIG. 1K, there is only one opening 122 in dielectric layer 120 that provides an electric path from the solder ball 155 down to the metal line 114. Alternatively, there can be multiple openings (similar to the opening 122) in the dielectric layer 120 so as to provide multiple electric paths from the solder ball 155 down to the metal line 114.

In the embodiments described above, with reference to FIGS. 1E and 2C, the BLM layer 140/240 comprises three layers: a titanium-tungsten (TiW) alloy layer (not shown), a copper layer (not shown) on top of the TiW alloy layer, and a nickel layer (not shown) on top of the copper layer. Alternatively, the BLM layer 140/240 can comprise four layers: a titanium-tungsten (TiW) alloy layer (not shown), a copper layer (not shown) on top of the TiW alloy layer, a nickel layer (not shown) on top of the copper layer, and another copper (or another metal) layer (not shown) on top of the nickel layer.

In one embodiment, whenever a Cu or Ni layer is to be formed on an underlying layer by plating, a thin coating layer of sputtered Cu (or other suitable metal or metals), at least 200 Angstroms thick, should be sputtered over the underlying layer to promote the subsequent plating.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure fabrication method, comprising:
providing a structure which includes a first dielectric layer which includes a top dielectric surface, an electrically conductive line in the first dielectric layer, a second dielectric layer on the first dielectric layer and the electrically conductive line, and a patterned polyimide layer on the second dielectric layer;
forming a ball-limiting-metallurgy (BLM) region on the second dielectric layer, the electrically conductive line, and the patterned polyimide layer, wherein the BLM region is electrically connected to the electrically conductive line; and
forming a solder ball on the BLM region, wherein the solder ball is electrically connected to the BLM region, wherein the BLM region has a characteristic that a length of the longest straight line segment which is parallel to the top dielectric surface of the first dielectric layer and is entirely in the BLM region does not exceed a pre-specified maximum value, and wherein the pre-specified maximum value is at most one-half of a maximum horizontal dimension of the BLM region measured in a horizontal direction parallel to the top dielectric surface of the first dielectric layer.

2. The method of claim 1, wherein the pre-specified maximum value is at most one-fourth of the maximum horizontal dimension of the BLM region.

3. The method of claim 1, wherein the BLM region is in direct physical contact with the electrically conductive line through an opening of the second dielectric layer.

4. The method of claim 1, wherein if the top dielectric surface is parallel to the ground surface of the earth such that the first dielectric layer is disposed between the BLM region and the earth, and if water is poured on the BLM region without any regions or layers that stop the water from reaching the BLM region, then after said pouring is performed, and as a result of said pouring, there will be on the BLM region at least two bodies of water each body of which is not in direct physical contact with any other body of water.

5. The method of claim 1, wherein if the top dielectric surface is parallel to the ground surface of the earth such that the BLM region is disposed between the first dielectric layer and the earth, and if water is poured on the BLM region without any regions or layers that stop the water from reaching the BLM region, then after said pouring is performed, and as a result of said pouring, there will be on the BLM region at least two bodies of water each body of which is not in direct physical contact with any other body of water.

6. The method of claim 1, wherein a first external surface of the electrically conductive line is in direct physical contact with the first dielectric layer, wherein a second external surface of the electrically conductive line is in direct physical contact with the second dielectric layer, and wherein first and second external surfaces of the electrically conductive line are parallel to and displaced from each other.

7. A structure fabrication method, comprising:
providing a structure which includes a first dielectric layer which includes a top dielectric surface, an electrically conductive line in the first dielectric layer, a second dielectric layer on the first dielectric layer and the electrically conductive line, and a polyimide layer on the second dielectric layer;
specifying a maximum horizontal dimension for a ball-limiting-metallurgy (BLM) region measured in a horizontal direction parallel to the top dielectric surface of the first dielectric layer;
after said specifying is performed, determining a maximum length which is equal to one half of the specified maximum horizontal dimension;
after said determining is performed, designing a pattern to be transferred to the polyimide layer such that the subsequently formed BLM region formed on the polyimide layer has a characteristic that a length of the longest straight line segment which is parallel to the top dielectric surface of the first dielectric layer and is entirely in the BLM region does not exceed the determined maximum length;
after said designing is performed, transferring the pattern to the polyimide layer;
after said transferring the pattern to the polyimide layer is performed, forming the BLM region on the second dielectric layer and the electrically conductive line, wherein the BLM region is electrically connected to the electrically conductive line; and
forming a solder ball on the BLM region, wherein the solder ball is electrically connected to the BLM region, and wherein the BLM region has said characteristic.

8. The method of claim 7, wherein the determined maximum length is at most one-fourth of the maximum horizontal dimension of the BLM region.

9. The method of claim 7, wherein the BLM region is in direct physical contact with the electrically conductive line through an opening of the second dielectric layer.

10. The method of claim 7, wherein if the top dielectric surface is parallel to the ground surface of the earth such that the first dielectric layer is disposed between the BLM region and the earth, and if water is poured on the BLM region without any regions or layers that stop the water from reaching the BLM region, then after said pouring is performed, and as a result of said pouring, there will be on the BLM region at least two bodies of water each body of which is not in direct physical contact with any other body of water.

11. The method of claim 7, wherein if the top dielectric surface is parallel to the ground surface of the earth such that the BLM region is disposed between the first dielectric layer and the earth, and if water is poured on the BLM region without any regions or layers that stop the water from reaching the BLM region, then after said pouring is performed, and as a result of said pouring, there will be on the BLM region at least two bodies of water each body of which is not in direct physical contact with any other body of water.

12. The method of claim 7, wherein a first external surface of the electrically conductive line is in direct physical contact with the first dielectric layer, wherein a second external surface of the electrically conductive line is in direct physical contact with the second dielectric layer, and wherein first and second external surfaces of the electrically conductive line are parallel to and displaced from each other.

* * * * *